(12) United States Patent
Yanagimoto et al.

(10) Patent No.: US 6,703,186 B1
(45) Date of Patent: Mar. 9, 2004

(54) METHOD OF FORMING A CONDUCTIVE PATTERN ON A CIRCUIT BOARD

(75) Inventors: Hiroshi Yanagimoto, Hyogo (JP); Masahito Kawahara, Osaka (JP)

(73) Assignee: Mitsuboshi Belting Ltd., Kobe (JP)

( * ) Notice: Subject to any disclaimer, the term of this patent is extended or adjusted under 35 U.S.C. 154(b) by 32 days.

(21) Appl. No.: 09/637,130

(22) Filed: Aug. 10, 2000

(30) Foreign Application Priority Data

Aug. 11, 1999 (JP) ............................................ 11-227170

(51) Int. Cl.⁷ .............................. G06F 7/00; B05D 5/00
(52) U.S. Cl. ....................... 430/314; 430/311; 430/312; 430/313; 430/318; 430/330; 427/96; 427/229; 427/304
(58) Field of Search ................................. 430/311, 312, 430/313, 314, 318, 330; 427/96, 229, 304

(56) References Cited

U.S. PATENT DOCUMENTS

| | | | |
|---|---|---|---|
| 3,772,056 A | * 11/1973 | Polichette et al. | 117/47 |
| 3,900,320 A | * 8/1975 | Rolkers et al. | 117/47 |
| 4,216,246 A | * 8/1980 | Iwasaki et al. | 427/43.1 |
| 4,388,351 A | * 6/1983 | Sawyer | 427/304 |
| 4,643,798 A | * 2/1987 | Takada et al. | 156/630 |
| 4,788,167 A | * 11/1988 | Mathers et al. | 501/98 |
| 4,830,880 A | * 5/1989 | Okubi et al. | 427/229 |
| 5,210,511 A | * 5/1993 | Izumi et al. | 333/222 |
| 5,419,946 A | * 5/1995 | Takanezawa et al. | 428/206 |
| 5,457,079 A | * 10/1995 | Itabashi et al. | 502/331 |
| 5,492,613 A | 2/1996 | Zhang et al. | 205/163 |
| 5,660,883 A | 8/1997 | Omura | 427/304 |

FOREIGN PATENT DOCUMENTS

| | | | |
|---|---|---|---|
| EP | 0 394 987 | 10/1990 | H01L/21/48 |
| JP | 2001-119128 | * 4/2001 | H05K/3/18 |
| JP | 2001-226178 | * 8/2001 | C04B/41/90 |

OTHER PUBLICATIONS

JPO Abstract of JP 2002–141639, "Metallization of Ceramic Circuit Boards", Kawahara et al., May 2002.*

* cited by examiner

*Primary Examiner*—Mark F. Huff
*Assistant Examiner*—Nicole Barreca
(74) *Attorney, Agent, or Firm*—Wood, Phillips, Katz, Clark & Mortimer

(57) ABSTRACT

A method of forming a conductive circuit pattern on a circuit board having a first region, on which a desired conductive circuit pattern is to be formed, and a second region. The method includes the step of applying a coating including a solution with conductive particles to the circuit board. The coating is heated to adhere the conductive particles to the circuit board. The conductive particles are removed in the second region. The second region is shielded and, with the second region shielded, a conductive film is formed on the first region.

13 Claims, 2 Drawing Sheets

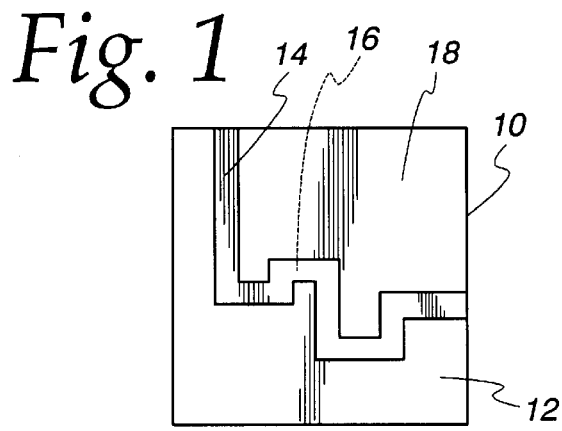
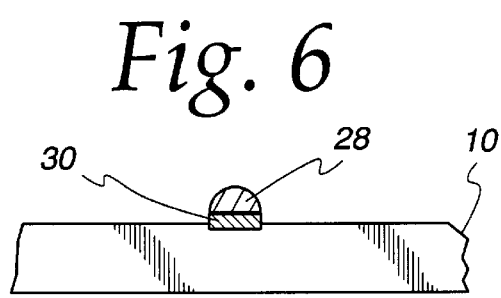
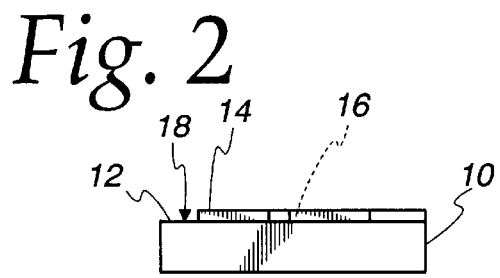
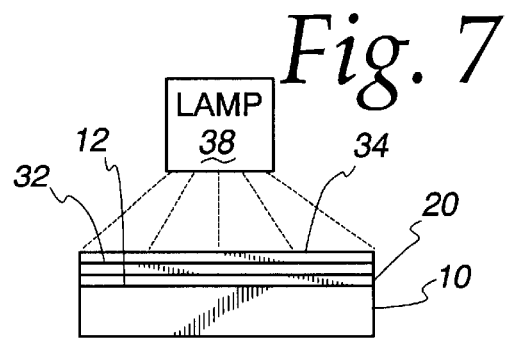
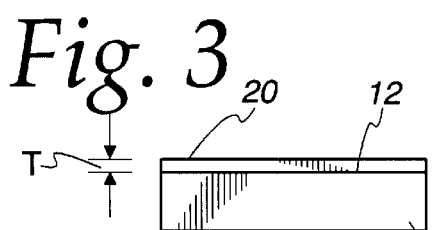
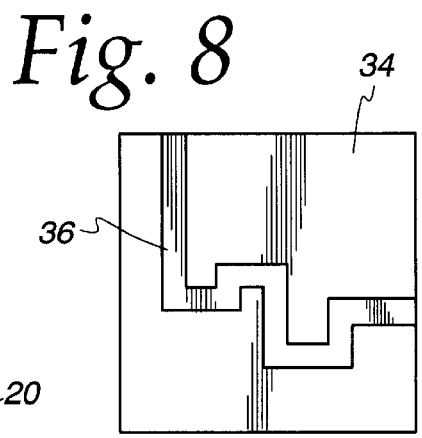
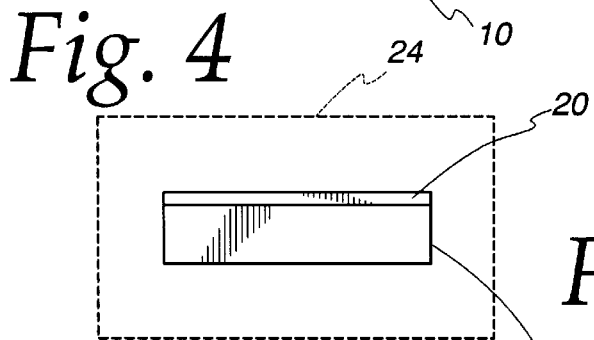
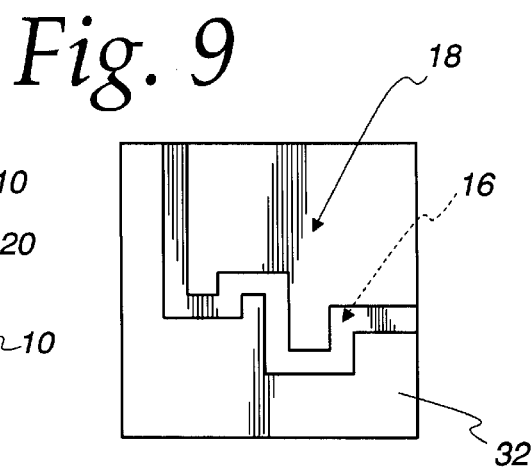
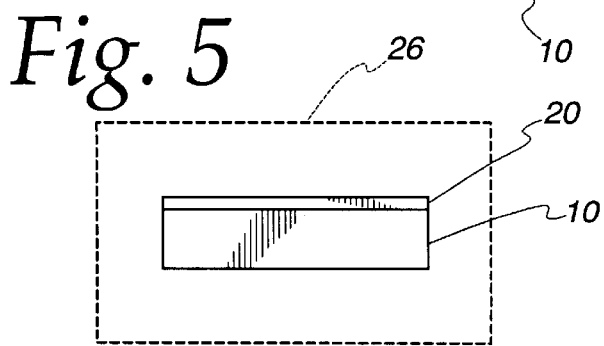

METHOD OF FORMING A CONDUCTIVE PATTERN ON A CIRCUIT BOARD

BACKGROUND OF THE INVENTION

1. Field of the Invention

This invention relates to circuit boards and, more particularly, to a method of forming a conductive pattern on a circuit board.

2. Background Art

It is well known to make conductive patterns on circuit boards for electronic equipment utilizing a ceramic circuit board with a metal layer formed in a predetermined pattern defining a conductive path on the board. Typically, the circuit board may be made from sintered aluminum oxide, sintered aluminum nitride, sintered silicon carbide, or the like, or glass board with good adhesion properties.

In a conventional electroless plating method, the surface of the ceramic board is roughened by a chemical or physical process. The board is then treated in a concentrated hydrochloric acid solution of $SnCl_2$ to sensitize the surface thereof. The board is treated in a concentrated hydrochloric acid solution of $PdCl_2$ to form plating metal nuclei of Pd on the surface. The board is then placed in a plating bath containing gold, silver, copper, nickel, or the like to form a metal layer thereon. This plating process is performed without the use of an electric current, i.e. in an electroless process.

While this plating method is desirable from the standpoint of cost, it has some drawbacks. The surface of the board is roughened to improve adhesive strength and to increase the surface area thereof so that, for example, palladium particles are bonded as catalytic nuclei for plating film deposition on the board surface. However, the adhesion between the plating particles and the board surface may not be as strong as is desirable. Further, the high frequency characteristics of the board may deteriorate by reason of the board surface being roughened. Further, this plating process cannot be used for a board whose surface cannot be roughened. Among these boards are high purity alumina and aluminum nitride boards.

An alternative conventional method of forming circuit boards involves vapor deposition of a metal. In the process, a metal is evaporated by, for example, argon sputtering to deposit the metal on a ceramic board, with the board placed in a vacuum. Since generally an adequate adhesive force between the board and gold, silver, copper, nickel or the like cannot be realized, an intermediate layer having better adhesive characteristics is commonly formed against the board. A metal film is then formed to produce the desired conductive path.

The vapor deposition process is desirable in that the conductive path can be formed on high purity alumina, aluminum nitride, or the like on which conductive paths cannot effectively be formed by the above-described electroless plating method. The metal film can be formed on the board without surface roughening, as a consequence of which high frequency characteristics are not compromised. However, the vapor deposition method is more costly than the electroless plating process described above.

SUMMARY OF THE INVENTION

In one form, the invention is directed to a method of forming a conductive circuit pattern on a circuit board having a first region, on which a desired conductive circuit pattern is to be formed, and a second region. The method includes the step of applying a coating including a solution with conductive particles to the circuit board. The coating is heated to adhere the conductive particles to the circuit board. The conductive particles are removed in the second region. The second region is shielded and, with the second region shielded, a conductive film is formed on the first region.

In one form, the circuit board is made from a ceramic material.

The circuit board may be made from at least one of a) sintered aluminum oxide, b) sintered aluminum nitride, and c) sintered barium titanate.

In one form, the coating is a fine particle dispersed solution with fine particles that are at least one of copper and copper oxide.

In one form, the particles have a diameter of 1–500 nm.

In one form, the step of heating the coating involves burning the coating in an inert gas atmosphere to adhere copper fine particles as plating catalytic nuclei to the circuit board.

The heating step may involve burning at a temperature of 500–1100° C. for one to sixty minutes.

In one form, the step of removing the conductive particles may involve removing the plating catalytic nuclei by etching.

In one form, the step of shielding the second region may involve applying a resist film.

The resist film may be one of a) a dry film and b) resist ink.

The step of forming a conductive film may involve forming a copper film by electroless copper plating.

The method may further include the step of removing the resist film after forming the copper film.

In one form, the fine particle dispersed solution consists of fine particles dispersed in a solvent.

The fine particles may be copper that is present in an amount of 0.01–80% by weight.

The solvent may be, for example, at least one of a) α-terpineol, b) methanol, c) ethanol, d) water, e) carbitol, and f) methacresol.

In one form, the fine particles are dispersed in the solvent in an amount of 0.001–10 weight %.

The coating may be applied to a surface of the circuit board to a thickness of 10–1000 nm.

In one form, the step of drying the coating involves heating at a temperature between 80° C. and 500° C.

The method may further include the steps of applying a negative film having a transparent portion corresponding to the first region, and curing the resist film.

In one form, the method further includes the steps of removing the negative film and removing the resist film in the second region by developing.

The method may further include the step of removing the resist film in the first region. In one form, this is carried out using a solvent.

In one form, the coating consists of fine particles dispersed in a polymer. Alternatively, the fine particles may be dispersed in an oligomer matrix.

In one form, the coating consists of at least one of a polymer, an oligomer, and a solvent applied to a circuit board as a film, and the fine particles include at least one of copper and copper oxide applied to the film.

The film may be mixed with a solvent to effect dispersal of the particles.

In another form, the invention is directed to a method of forming a conductive circuit pattern on a circuit board having a first region on which a desired conductive circuit is to be formed, and a second region. The method involves the step of applying a coating consisting of a first solution including conductive particles of a diameter of 1–500 nm to an unroughened surface of the circuit board. The coating is heated to bond the conductive particles to the circuit board. The conductive particles are removed in the second region.

In one form, the conductive particles are at least one of copper and copper oxide.

The method may further include the steps of shielding the second region and, with the second region shielded, forming a conductive film in the first region.

BRIEF DESCRIPTION OF THE DRAWINGS

FIG. 1 is a plan view of a circuit board, with a conductive circuit pattern thereon, made according to the present invention;

FIG. 2 is an end elevation view of the circuit board in FIG. 1;

FIG. 3 is a view as in FIG. 2 with a coating, including conductive particles, applied thereto according to the present invention;

FIG. 4 is a view as in FIG. 3 with the circuit board with the coating thereon in an oven for heating to dry the coating;

FIG. 5 is a view as in FIG. 4 with the circuit board in a furnace to actively bond the conductive particles with the circuit board;

FIG. 6 is an enlarged, fragmentary cross-sectional view of the circuit board of FIG. 1 showing fine particles adhered as plating catalytic nuclei to the circuit board resulting from the heating in FIG. 5;

FIG. 7 is a view as in FIG. 2 with the circuit board having a resist film and a negative film applied thereto, with the negative film having a transparent portion corresponding to the desired circuit pattern and with a lamp irradiating the resist film through the negative film;

FIG. 8 is a plan view of the negative film of FIG. 7;

FIG. 9 is a plan view of the circuit board in FIG. 7 after irradiation;

DETAILED DESCRIPTION OF THE DRAWINGS

Figure 10:
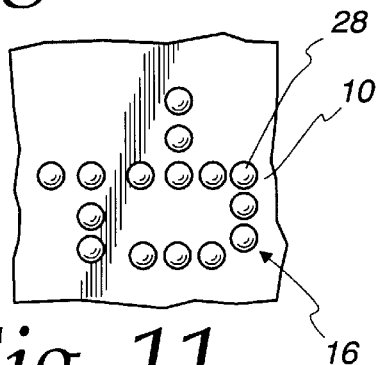
FIG. 10 is an enlarged fragmentary plan view of the circuit board of FIG. 2 showing fine particles dispersed in a part of the circuit pattern.

Referring initially to FIGS. 1 and 2, a printed circuit board is shown at 10 with a surface 12 on which a conductive circuit pattern 14 is formed. The shape of the circuit pattern has no particular significance, with the shape depicted shown only for purposes of illustration. The circuit pattern 14 overlies a corresponding first region 16 of the surface 12, with the remainder of the surface 12 on which the circuit pattern 14 is not provided defining a second region 18.

In forming the circuit board 10 with the conductive circuit pattern 14 thereon, the circuit board 10 is initially processed, as shown in FIG. 3, by applying a fine particle dispersed solution to the surface 12 to form a coating 20. The solution contains fine particles of at least one of copper and copper oxide, with the particles having a diameter of 1–500 nm. The coating 20 has a thickness T of 10–1000 nm.

The material for the circuit board 10 is preferably selected from sintered aluminum oxide, sintered aluminum nitride, sintered barium titanate, and the like. It is known to apply a coating by various conventional methods, among which are spin coating, dipping, brush coating, spraying, etc. The spin coating method is preferred because it can be used to produce the desired uniform thickness for the coating 20.

The fine particle dispersed solution may be prepared by dispersing the copper/copper oxide particles in a solvent. The fine copper/copper oxide particles, by reason of their small diameter, have generally high reactivity as compared with larger particles. By using the fine particles, catalytic nuclei for plating copper on the surface 12 of the board 10 can be formed without roughening and sensitizing the surface 12 of the circuit board 10. An effective adhesive force can be developed between the board and the catalytic nuclei.

The copper/copper oxide particles can be produced, as by a method referred to as "a gas evaporation method", as disclosed in Japanese Unexamined Patent Publication No. 3-34211. With this method, a metal is evaporated in a chamber in which an inert gas, such as helium, or the like, is introduced. At the point that the particles are isolated, immediately after being formed by cold condensation by collision with the inert gas, a vapor of an organic solvent such as α-terpineol, toluene, or the like, is introduced to coat the surfaces of the particles to obtain the fine particles of copper/copper oxide. Fine particles produced in this manner are available commercially. One such source is Vacuum Metallurgy Co., Ltd.

Other known production methods for the particles include a reduction method, an atomizing method, etc. Fine particles made by these methods are available commercially through, among others, the following companies: Nihon Atomize Kako Co., Ltd., Fukuda Kinzokuhakuko Co., Ltd., Dowa Mining Co., Ltd., and Mitsui Mining & Smelting Co., Ltd.

Many different solvents can be utilized. Suitable solvents are α-terpineol, methanol, ethanol, water, carbitol, methacresol, and the like. These solvents are desired for their ability to disperse fine particles, because of their stability over time, and because of their wetting ability with the board.

Although the amount of copper/copper oxide dispersed in the solvent can vary depending upon the particular application, in most applications, the amount is controlled to be in the range of 0.001–10 wt. %. This accounts for uniform coating of the fine particles and the formation of a continuous film after heating/burning, as hereinbelow described.

Next, as shown in FIG. 4, preliminary heating is performed to remove the solvent. The circuit board 10 with the coating 20 applied is heated in an oven 24 at a temperature between 80 and 500° C. The lower limit of 80° is chosen so that the solvent can be dried. The upper limit is chosen so that there is not excessive sintering of the fine particles.

In the drying step, the polymer is preferably completely removed or partially decomposed by carbonization to an extent which permits complete removal in the next heating/burning step, which occurs in an inert atmosphere.

As shown in FIG. 5, heating/burning is carried out in an atmosphere which may include an inert gas such as $N_2$, or the like. The circuit board 10 with the layer 20 applied thereto is heated in a nitrogen flow belt furnace 26 at a temperature of 500–1100° C. for one to sixty minutes to reactively bond copper fine particles, as shown at 28 in FIG. 6, to the circuit board 10. As further shown in FIG. 6, adhesive products 30 of $CuAl_2O_4$ or $CuAlO_2$ are formed at the interface between the copper fine particles 28 and the circuit board 10. This results in a firm fixing of the copper fine particles 28 as plating catalytic nuclei to the circuit board 10.

Since the amount of oxygen depends upon the type of copper fine particles, or the amount necessary for decomposing the carbon remaining in the drying step, the amount of oxygen is not limited to any specific amount.

As shown in FIG. 7, the entire area of the surface 12 with the coating 20 thereon is coated with a resist film 32. The resist film 32 may be a dry film or resist ink.

To form a desired circuit pattern in the resist film 32, as shown also in FIG. 8, a negative film 34 with a transparent portion 36 corresponding to the shape of the circuit pattern 14, is placed against the resist film 32 and irradiated by an ultraviolet exposure lamp 38 to cure the resist film 32 by exposure.

As seen in FIG. 9, after the negative film 34 is removed, the unexposed resist portion which occupies the second region 18 is removed by developing. Copper in the second region 18 is then removed with a copper etchant, for example, ferric chloride or cupric chloride aqueous solution. Then, the resist film 32 on the circuit pattern in the first region 16 is removed by a solvent which may be, for example, dichloromethane. As shown in FIG. 10, the resulting circuit board 10 has copper fine particles 28 dispersed in the first region 16.

Figure 11:
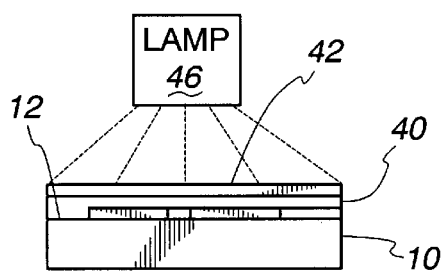
FIG. 11 is an end elevation view of the circuit board with a negative film applied thereto having a transparent portion corresponding to the first region and being irradiated by a lamp.
Figure 12:
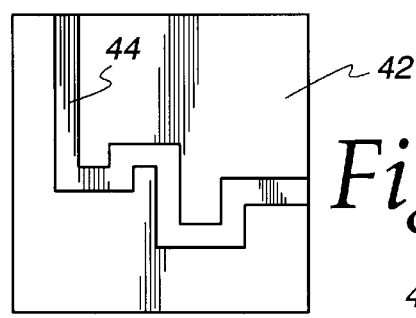
FIG. 12 is a plan view of the negative film used in FIG. 11.
Figure 13:
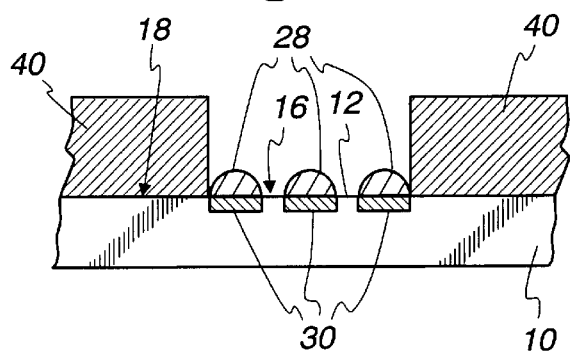
FIG. 13 is an enlarged, fragmentary, cross-sectional view of the printed circuit board in which copper fine particles are adhered in the first region and a resist film is applied in the second region.

As shown in FIGS. 11 and 12, the entire area of the surface 12 is coated with a resist film 40 and a negative film 42 having a nontransparent portion 44 corresponding to the shape of the first region, i.e., where the circuit pattern 14 is defined. The structure is then irradiated using an ultraviolet lamp 46 to cure the resist film 40 by exposure. The uncured portion is removed by development to produce the circuit board 10 shown in FIG. 13. The board 10 has copper fine particles 28 adhered in the first region 16. The second region 18 is coated with the resist film 40.

Figure 14:
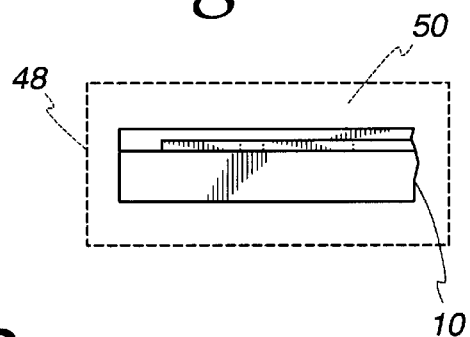
FIG. 14 is an end elevation view of the circuit board as in FIG. 13 which is dipped in a copper plating solution to deposit copper in the first region.
Figure 15:
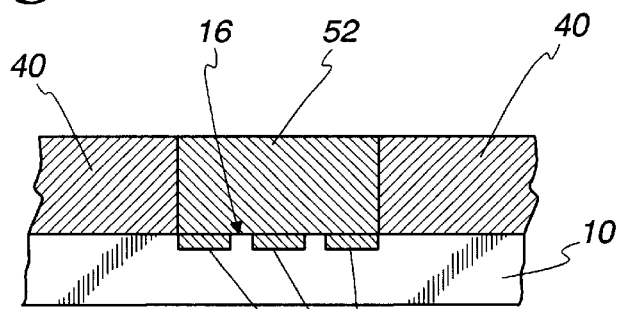
FIG. 15 is an enlarged, fragmentary, cross-sectional view of the circuit board of FIG. 14 after dipping.
Figure 16:
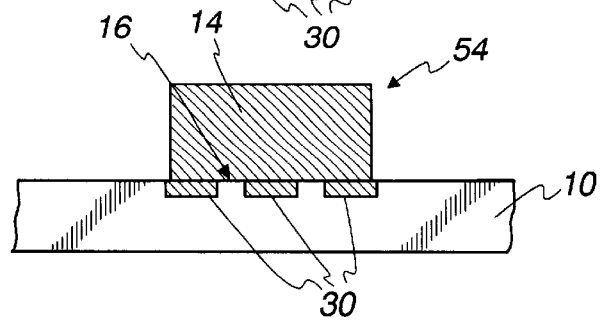
FIG. 16 is a view as in FIG. 15 after the resist film is removed to define a completed circuit board with a conductive circuit pattern thereon made according to the present invention.

As shown in FIG. 14, the board 10 is then dipped into a container 48 having a supply of copper plating solution 50 to thereby form a copper film 52 in the first region 16, as shown in FIG. 15. The resist film 40 is then removed, as described above, to produce a completed printed circuit board, as shown at 54 in FIG. 16, including the circuit board 10 with the conductive circuit pattern 14 in the first region 16. The conductive circuit pattern 14, on a one-to-one scale, is actually a fine line.

Another example of a fine particle dispersed coating is one formed by dispersing fine particles of at least one of copper and copper oxide with a particle diameter of 1–500 nm in a polymer matrix. The polymer adheres to the periphery of the copper/copper oxide fine particles to prevent agglomeration, suppressing grain growth during sintering.

The polymer is melted at a temperature higher than its melting temperature. The melted polymer is immediately poured into liquid nitrogen to be rapidly cooled to obtain a thermodynamically nonequilibrium polymer layer. Copper is deposited on the surface of the polymer layer by using a vacuum deposition apparatus. Alternatively, a copper foil or copper sheet is adhered to the polymer layer.

The composite product, consisting of the polymer layer and the copper adhered to the surface thereof, is heated at a temperature from the glass transition temperature of the polymer to the melting point of the polymer to change the polymer from the nonequilibrium state to a stable state. As a result, copper fine particles of 100 nm or less, which have a particle size distribution with a peak in the region of 1–10 nm, are produced and diffused into the polymer layer. This state continues until the polymer layer is completely stabilized and the copper fine particles are finally held in the polymer layer. The copper particles are dispersed in the polymer in a content in the range of 0.01–80 percent by weight without agglomerating.

The coating can also be made by the following method. A paste material is prepared by dissolving a polymer or oligomer in an organic solvent, with the resulting composition applied on the surface 12 of the circuit board 10 to form a thin film coating thereon. The polymer or oligomer has at least one type of functional group selected from cyano groups (—CN), amino groups (—$NH_3$), and thiol groups (—SH), in the terminals or side chains of the molecule, and a skeleton consisting of polyethylene oxide, polyethylene glycol, polyvinyl alcohol, nylon 11, or the like. The melting or softening point is 40–100° C. The average molecular weight of the polymer or oligomer is preferably about 500–3000. However, the average molecular weight is not limited to being within this range.

Copper is then deposited on the film/coating under vacuum. The deposited copper is densely deposited as copper or copper oxide fine particles. In this state, the fine particles begin to diffuse into the coating/film and are further heated to obtain a copper fine particle dispersion.

The resulting fine particle copper dispersion is mixed with and dissolved in an organic solvent such as ethanol, methacresol dimethylformamide, cyclohexane, formic acid, or the like, to uniformly disperse the fine particles.

The invention permits fine conductive lines, with high resolution, to be formed on a ceramic board without preilminary roughening thereof.

Examples of methods of making a circuit board with a conductive circuit pattern thereon according to the present invention, and according to the prior art, will now be described, and their characteristics compared.

INVENTIVE EXAMPLE NO. 1

A fine particle dispersed solution was prepared by dispersing copper fine particles having a particle diameter of 5 nm in ethanol at a concentration of 0.5 wt. %. A ceramic circuit board made of 96% alumina was used. The fine particle dispersed solution was coated on the surface of the ceramic board by a spin coating process. The rotational speed was 1000 rpm during the process.

The ceramic board was then dried in an oven at 150° C. for twenty minutes and then heated/burned in a nitrogen flow belt furnace at an upper temperature of 900° C. for ten minutes.

Resist ink, which was photosensitive resin PO-2, produced by Tokyo Ohka Kogyo Co., Ltd., was coated over the entire surface of the board. A negative film having a transparent portion with a shape corresponding to the desired conductive circuit pattern, was placed on the resist film and irradiated by an ultraviolet exposure lamp to cure the resist by exposure. The uncured portion of the resist was removed by development. The copper fine particles on the second region were removed by pickling with a ferric chloride aqueous solution. The resist film on the first region was removed with dichloromethane.

The same resist ink as described above was coated over the entire surface of the resulting board. A negative film having a non-transparent portion on the first region was placed on the resist film. Irradiation was carried out using an ultraviolet exposure lamp to cure the resist by exposure. The uncured portion of the resist on the first region was removed by development.

An electroless copper plating solution, produced by Okuno Chemical Industries Co., Ltd., and identified as the product NICORON U, was placed in a bath at a temperature of 65° C. The board was dipped in this solution to deposit a copper film having a 5 μm thickness on the first region.

A fine line of copper film was formed at line/space=25μm/25μm on the circuit board. As a result of a tape peeling test, in which a commercial adhesive tape was applied to the circuit pattern on the circuit board and peeled therefrom to observe plating state, no peeling of the copper film was observed. Good adhesion between the copper film and the circuit board was confirmed.

INVENTIVE EXAMPLE NO. 2

A thin film of diamine-terminated polyethylene oxide having a thickness of 800 nm was prepared. Copper was vacuum-deposited on the thin film to form a copper fine particle dispersion containing 10 wt. % copper fine particles. The copper fine particle dispersion was dissolved in ethanol with the concentration of the copper fine particles being 0.5 wt. %. The solution was then coated on the same ceramic board as for Inventive Example No. 1 by a spin coating method at a rotational speed of 2000 rpm. The same procedures as for Inventive Example No. 1 was repeated to form a fine line of a copper film on the ceramic circuit board.

Using the same tape peeling test as with Inventive Example No. 1, good adhesion between the copper film and the board was confirmed.

COMPARATIVE EXAMPLE NO. 1

Comparative Example No. 1 employed conventional electrolysis plating. More particularly, a ceramic board made of 96% alumina was dipped in an alkali solution for thirty seconds to roughen the surface thereof. The ceramic board was then dipped in a concentrated hydrochloric acid solution of $SnCl_2$ to sensitize the surface of the board, and then dipped in a concentrated hydrochloric acid solution of $PdCl_2$ to form catalytic nuclei.

An electrolysis plating solution, produced by Okuno Chemical Industries Co., Ltd., as its product NICORON U, was placed in a bath at 65° C. The board was dipped in the bath to deposit a copper film, having a 5 μm thickness, to the circuit portion to produce a completed board.

In this example, good adhesion between the copper film and the board resulted. However, since copper fine particles were not used as plating catalytic nuclei, the plating catalytic nuclei could not be removed by etching. Thus, it was not possible to form a copper film only in the circuit pattern region.

The foregoing disclosure of specific embodiments is intended to be illustrative of the broad concepts comprehended by the invention.

We claim:

1. A method of forming a conductive circuit pattern on a circuit board having a first region on which a desired conductive circuit pattern is to be formed and a second region, said method comprising the steps of:

applying a coating comprising fine conductive particles of a least one of copper and copper oxide and having a diameter of 1–500 nm in a solution comprising at least one of a polymer and oligomer matrix in a solvent to the circuit board to a thickness of 10–1,000 nm, wherein the fine conductive particles are dispersed in the solvent in an amount of 0.001–10 wt. %;

drying the coating and removing the solvent by heating at a temperature in the range of 80–500° C.;

heating the coating in an inert gas atmosphere at a temperature of 500–1100° C. for one to sixty minutes to adhere the fine conductive particles to the circuit board;

removing the conductive particles in the second region; and forming a conductive film comprising copper on the first region, wherein the step of heating the coating comprises burning the coating to adhere conductive particles as plating catalytic nuclei to the circuit board.

2. The method of forming a conductive circuit pattern on a circuit board according to claim 1 wherein the circuit board comprises a ceramic material.

3. The method of forming a conductive circuit pattern according to claim 1 wherein the step of removing the conductive particles comprises removing the plating catalytic nuclei by etching.

4. The method of forming a conductive circuit pattern according to claim 1 further comprising the step of shielding the second region by applying a resist film and the step of forming a conductive film comprises forming a conductive film with the second region shielded.

5. The method of forming a conductive circuit pattern according to claim 4 further comprising the step of removing the resist film after forming the conductive film.

6. The method of forming a conductive circuit pattern according to claim 4 wherein the resist film comprises at least one of a) a dry film and b) resist ink.

7. The method of forming a conductive circuit pattern according to claim 4 further including the steps of applying a negative film having a transparent portion corresponding to the first region and curing the resist film.

8. The method of forming a conductive circuit pattern according to claim 7 further including the steps of removing the negative film and removing the resist film in the second region by developing.

9. The method of forming a conductive circuit pattern according to claim 8 further including the step of removing the resist film in the first region.

10. The method of forming a conductive circuit pattern according to claim 7 wherein the resist film on the first region is removed with a solvent.

11. The method of forming a conductive circuit pattern according to claim 1 wherein the step of forming a conductive film comprises forming a copper film by electroless copper plating.

12. The method of forming a conductive circuit pattern according to claim 1 wherein the circuit board comprises at least one of a) sintered aluminum oxide, b) sintered aluminum nitride, and c) sintered barium titanate.

13. The method of forming a conductive circuit pattern according to claim 1 wherein the solvent comprises at least one of a)α-terpineol, b) methanol, c) ethanol, d) water, e) carbitol, and f) methacresol.

* * * * *